(12) United States Patent
Otsuki

(10) Patent No.: US 7,569,887 B2
(45) Date of Patent: Aug. 4, 2009

(54) C-SHAPED DUMMY GATE ELECTRODE SEMICONDUCTOR DEVICE AND METHOD OF MANUFACTURING THE SAME

(75) Inventor: Kazutaka Otsuki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/205,179

(22) Filed: Aug. 17, 2005

(65) Prior Publication Data

US 2006/0038233 A1 Feb. 23, 2006

(30) Foreign Application Priority Data

Aug. 17, 2004 (JP) ............... 2004-237025

(51) Int. Cl.
*H01L 23/62* (2006.01)
(52) U.S. Cl. ............... 257/365; 257/E29.134
(58) Field of Classification Search ........... 257/401, 257/409, 365, E29.134
See application file for complete search history.

(56) References Cited

U.S. PATENT DOCUMENTS 6,140,687 A * 10/2000 Shimomura et al. ........ 257/401
6,207,984 B1 * 3/2001 Chang .................. 257/291
6,713,822 B2 * 3/2004 Shimoji .................. 257/401
6,965,150 B2 * 11/2005 Higashida et al. ......... 257/356
2003/0209758 A1 * 11/2003 Lee et al. ................ 257/336

FOREIGN PATENT DOCUMENTS

| JP | 60-225468 | 11/1985 |
| JP | 3-239368  | 10/1991 |
| JP | 4-254381  | 9/1992  |

* cited by examiner

*Primary Examiner*—Bradley K Smith
*Assistant Examiner*—Amar Movva
(74) *Attorney, Agent, or Firm*—Young & Thompson

(57) ABSTRACT

A semiconductor device has a substrate, a first gate electrode, and a second gate electrode. The substrate has an active region surrounded by an isolation region. The first gate electrode is formed on the active region through a gate insulating film. The second gate electrode is formed on the gate insulating film such that the second gate electrode overlaps at least a part of a boundary between the active region and the isolation region. The first gate electrode and the second gate electrode are separated from each other.

5 Claims, 10 Drawing Sheets

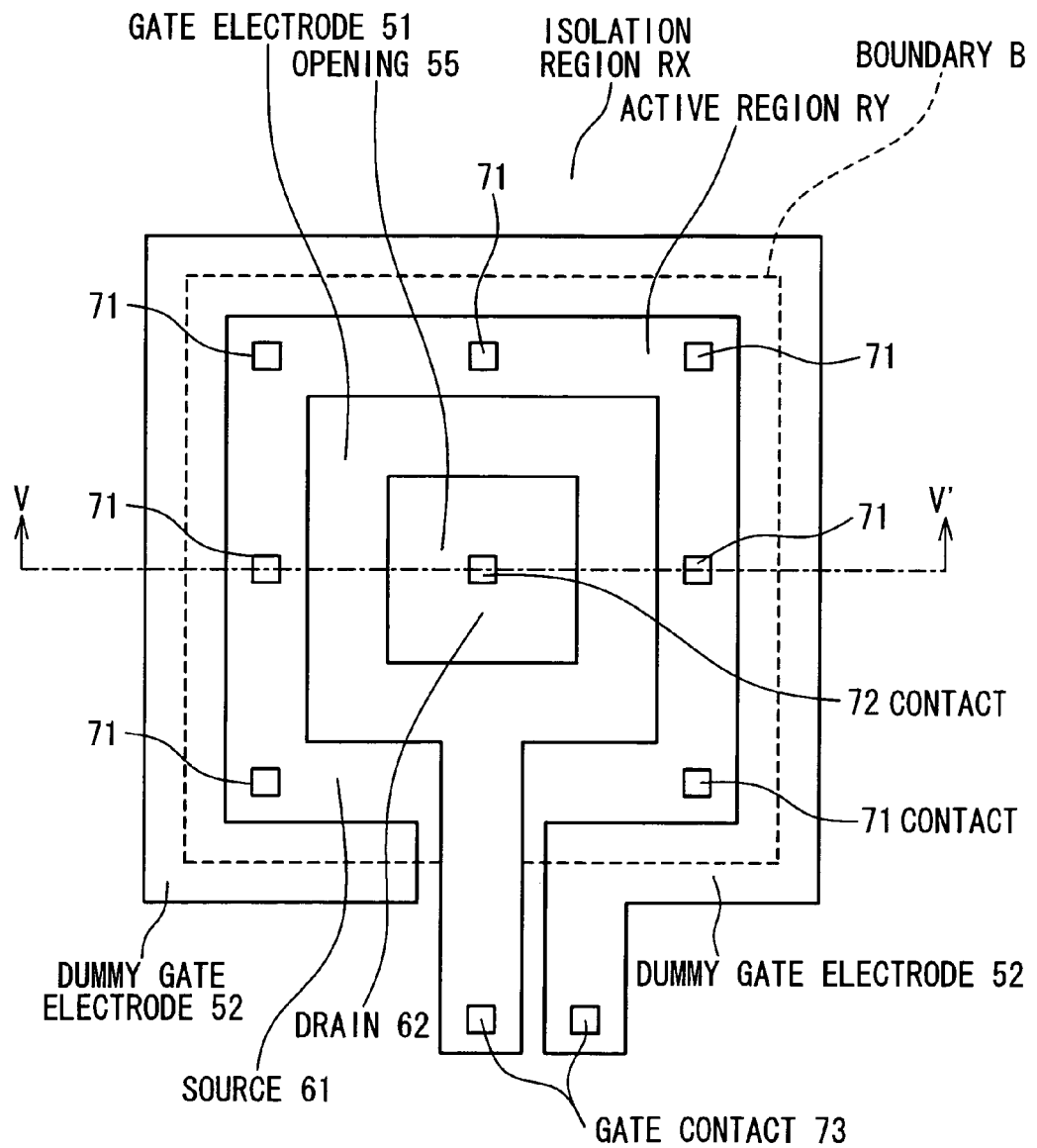

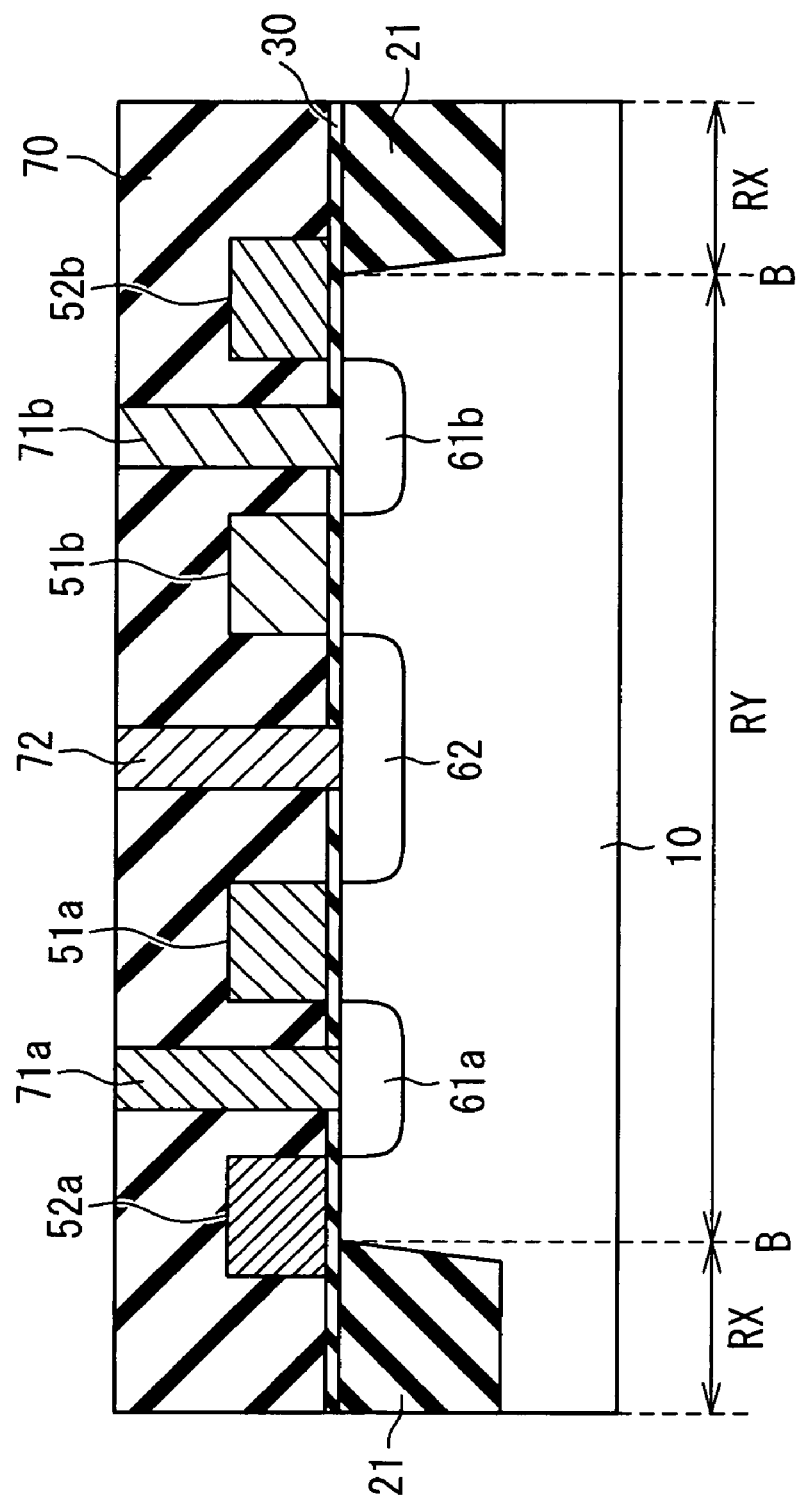

C-SHAPED DUMMY GATE ELECTRODE SEMICONDUCTOR DEVICE AND METHOD OF MANUFACTURING THE SAME

BACKGROUND OF THE INVENTION

1. Field of the Invention

The present invention relates to a semiconductor device. In particular, the present invention relates to a semiconductor device having a dummy gate electrode, and a method of manufacturing the semiconductor device.

2. Description of the Related Art

In a semiconductor device, crystal defects existing in a depletion layer and around a junction cause a leak current. The crystal defects tend to occur in a process of forming an isolation region. In a LOCOS (LOCal Oxidation of Silicon) method, for example, the crystal defects result from stress at a field oxidation. In an STI (Shallow Trench Isolation) method, the crystal defects tend to occur in a silicon substrate at the end of a trench due to stress caused by a difference in a thermal expansion coefficient between the silicon substrate and a buried oxide film. It is desired to eliminate circuit malfunctions due to the leak current and thus to improve reliability of the semiconductor device.

A technique disclosed in Japanese Laid Open Patent Application JP-Syo-60-225468 intends to provide a high-voltage field-effect semiconductor device capable of reducing a leak current. The semiconductor device has a semiconductor substrate, a device isolation insulating film formed in the semiconductor substrate, a high impurity layer formed immediately below the device isolation insulating film, a thin gate insulating film formed on a surface of an active region surrounded by the device isolation insulating film, an impurity non-injected region with a predetermined width provided near the gate insulating film along a boundary between the device isolation insulating film and the gate insulating film, source/drain regions formed in a region surrounded by the impurity non-injected region to be spaced apart from each other, and a gate metal layer formed on the gate insulating film to cover from a region between the source region and the drain region to the impurity non-injected region.

Also, the followings are known to the general public as conventional techniques intending to improve reliability of semiconductor devices.

A semiconductor device disclosed in Japanese Laid Open Patent Application JP-Heisei-3-239368 has a first gate electrode formed on an active region surrounded by an isolation insulating film provided in a semiconductor substrate, a second gate electrode formed to cover from a part of the insulating film to the active region, a drain region formed in the semiconductor substrate between the first and the second gate electrodes, and a channel stopper formed below the insulating film. The drain region and the channel stopper are formed so as to be separated from each other. The first gate electrode is electrically connected with the second gate electrode.

A semiconductor integrated circuit disclosed in Japanese Laid Open Patent Application JP-Heisei-4-254381 has a MIS-type semiconductor device in a device formation region surrounded by a field insulating film which forms an isolation region. A gate electrode of the MIS-type semiconductor device is formed to have a pattern portion extending along a boundary between the isolation region and the device formation region. A potential applied to the gate electrode is also applied to the pattern portion.

SUMMARY OF THE INVENTION

In a first aspect of the present invention, a semiconductor device has a substrate, a source, a drain, a first gate electrode, and a second gate electrode. The substrate has an active region surrounded by an isolation region. The source and the drain are formed in the active region. The first gate electrode is formed on a region between the source and the drain through a gate insulating film. The second gate electrode is formed on the gate insulating film such that the second gate electrode overlaps at least a part of a boundary between the active region and the isolation region. The first gate electrode and the second gate electrode are separated from each other.

In the semiconductor device thus constructed, the first gate electrode and the second gate electrode are physically separated from each other and are electrically disconnected from each other. That is to say, a potential applied to the first gate electrode is independent from a potential applied to the second gate electrode. Here, a substrate potential is applied to the second gate electrode. More specifically, when a conductivity type of the source/drain is the N-type, a ground potential is applied to the second gate electrode. On the other hand, when the conductivity type of the source/drain is the P-type, a power supply potential is applied to the second gate electrode. As a result, the leak current is prevented. Moreover, the source and the drain are formed apart from the isolation region. Therefore, the probability of the source/drain coming in contact with crystal defects at the end of the isolation region is greatly reduced. Thus, the leak current due to the crystal defects can be reduced.

In a second aspect of the present invention, a method of manufacturing a semiconductor device includes: (A) forming an isolation region surrounding an active region in a substrate; (B) forming a gate insulating film on the substrate; (C) depositing polysilicon on the gate insulating film; (D) etching the polysilicon by using a predetermined mask to form a first gate electrode located above the active region and a second gate electrode overlapping at least a part of a boundary between the active region and the isolation region, wherein the first gate electrode and the second gate electrode are separated from each other; and (E) forming a diffusion region in the active region with using the first gate electrode and the second gate electrode as a mask such that the diffusion region is self-aligned with the first gate electrode and the second gate electrode.

According to the semiconductor device and the method of manufacturing the semiconductor device of the present invention, the leak current is reduced. Thus, the reliability of the semiconductor device is improved.

BRIEF DESCRIPTION OF THE DRAWINGS

The above and other objects, advantages and features of the present invention will be more apparent from the following description taken in conjunction with the accompanying drawings, in which:

FIG. 4 is a plan view showing a structure of a semiconductor device according to a second embodiment of the present invention;

FIG. 5 is a cross-sectional view showing the structure of the semiconductor device according to the second embodiment of the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
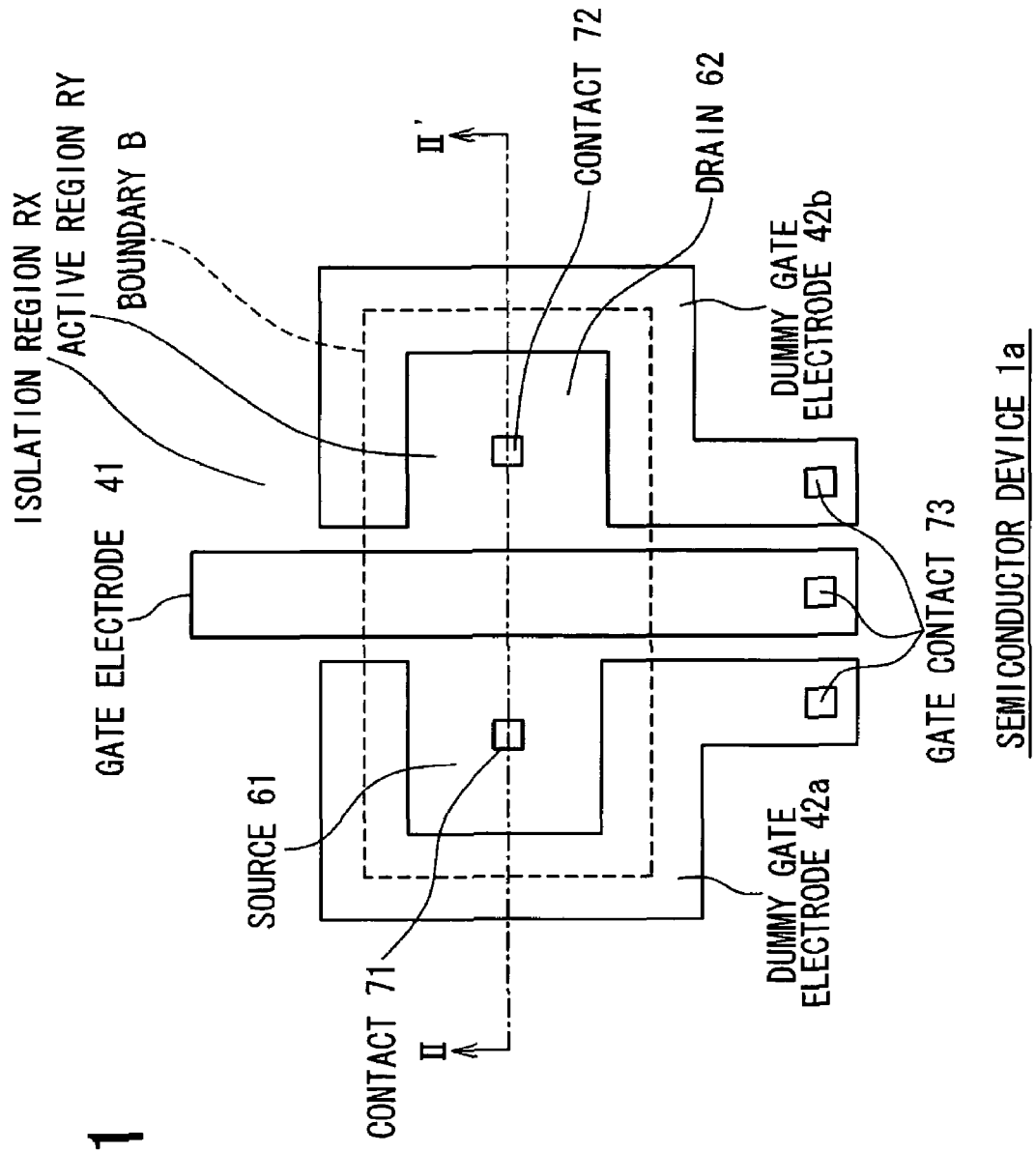
FIG. 1 is a plan view showing a structure of a semiconductor device according to a first embodiment of the present invention.

Structure:

FIG. 1 is a plan view showing a structure of a semiconductor device 1a according to a first embodiment of the present invention.

Figure 2:
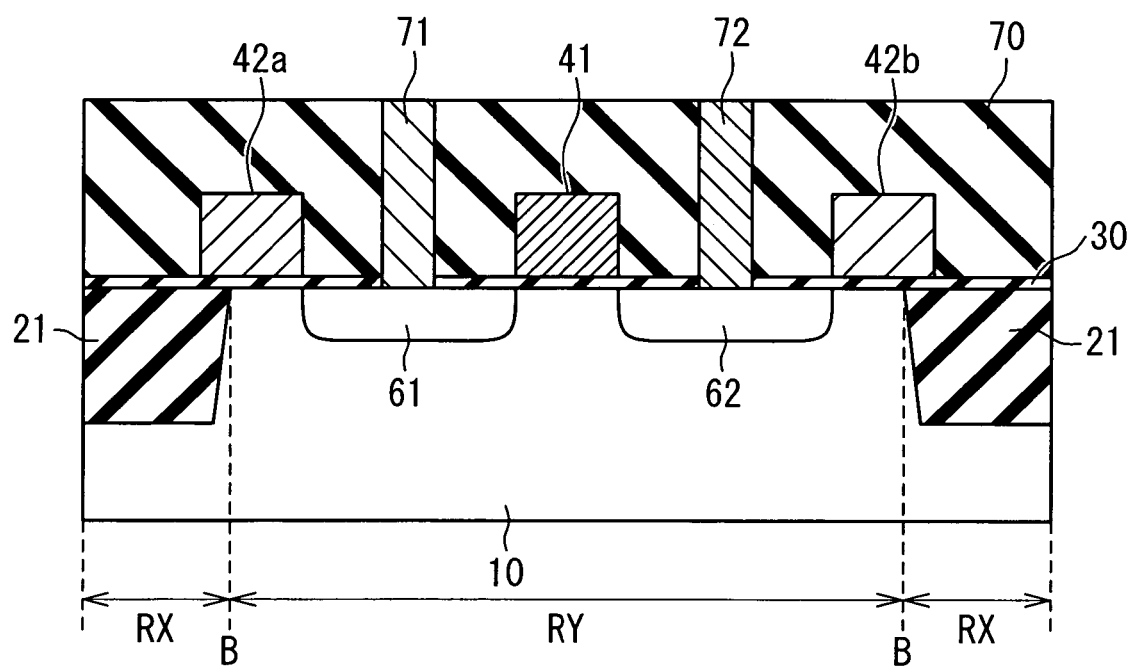
FIG. 2 is a cross-sectional view showing the structure of the semiconductor device according to the first embodiment of the present invention.

FIG. 2 is a cross-sectional view taken along a line II-II' in FIG. 1.

A substrate 10 of the semiconductor device 1a has an isolation region RX for isolating devices and an active region RY in which a device is formed. The active region RY is surrounded by the isolation region RX, and a reference mark "B" is given to a boundary (boundary region) between the isolation region RX and the active region RY on a surface of the substrate 10. As shown in FIG. 1, the isolation region RX is formed such that the boundary B has a rectangular shape on the surface of the substrate 10.

The isolation region (device isolation structure) RX is exemplified by an STI (Shallow Trench Isolation) structure. In this case, as shown in FIG. 2, a trench insulating film 21 is buried within a trench formed on the substrate 10. A source 61 and a drain 62 as diffusion regions are formed in the active region RY of the substrate 10. As shown in FIG. 2, the source 61 and the drain 62 are formed so as not to contact with the trench insulating film 21. In other words, the source 61 and the drain 62 are located apart from the isolation region RX.

As shown in FIG. 2, a gate insulating film 30 is formed on the substrate 10. A gate electrode 41 is formed on a channel region between the source 61 and the drain 62 through the gate insulating film 30. Also, an interlayer insulating film 70 is formed over the gate insulating film 30 and the gate electrode 41. Contacts 71 and 72 are formed to penetrate through the interlayer insulating film 70 and the gate insulating film 30, and are connected to the source 61 and the drain 62, respectively.

Further, in the present embodiment, a gate electrode other than the gate electrode 41 is formed on the gate insulating film 30. Hereinafter, the gate electrode is referred to as a "dummy gate electrode". As shown in FIGS. 1 and 2, dummy gate electrodes 42a and 42b are formed to overlap at least a part of the boundary B between the isolation region RX and the active region RY. More specifically, as shown in FIG. 1, the boundary B has the rectangular shape on the surface of the substrate 10, and the dummy gate electrodes 42a and 42b are formed along sides of the rectangle. As shown in FIG. 2, the dummy gate electrodes 42a and 42b are formed to straddle over the isolation region RX and the active region RY. Here, an edge of the dummy gate electrode 42a is substantially aligned with an edge of the source 61, and an edge of the dummy gate electrode 42b is substantially aligned with an edge of the drain 62.

As shown in FIG. 1, the gate electrode 41 crosses a portion of a first edge of the boundary B and a portion of a second edge of the boundary B. The first edge and the second edge are located opposite to each other. The dummy gate electrodes 42a and 42b are formed on the boundary B other than the crossing portions.

As described above, the semiconductor device 1a according to the present embodiment has the gate electrode 41 and the dummy gate electrodes 42a and 42b. As shown in FIG. 1, the gate electrode 41 and the dummy gate electrodes 42a and 42b are connected to gate contacts 73, respectively. In the present embodiment, the gate electrode 41 and the dummy gate electrodes 42a, 42b are physically separated from each other, and are electrically disconnected from each other. Thus, a potential applied to the dummy gate electrodes 42a and 42b is independent from a potential applied to the gate electrode 41. That is to say, the potential applied to the dummy gate electrodes 42a and 42b through the gate contacts 73 can be different from the potential applied to the gate electrode 41 through the gate contact 73.

Operation:

According to the first embodiment of the present invention, the potential of the dummy gate electrodes 42a and 42b and the potential of the gate electrode 41 are controlled independently. Applied to the dummy gate electrodes 42a and 42b is a substrate potential which is applied to the substrate 10. For example, when a conductivity type of the source 61 and the drain 62 is N-type, namely, when an N-channel transistor is configured, a positive potential is applied to the gate electrode 41 and a ground potential GND is applied to the dummy gate electrodes 42a and 42b at the time when the N-channel transistor is turned ON. On the other hand, when the conductivity type of the source 61 and the drain 62 is P-type, namely, a P-channel transistor is configured, a ground potential is applied to the gate electrode 41 and a power supply potential VDD is applied to the dummy gate electrodes 42a and 42b.

Effects of the semiconductor device 1a with the above-mentioned structure and operation are as follows.

If the gate electrode 41 and the dummy gate electrode 42 (42a, 42b) are electrically connected to each other, the potential of the gate electrode 41 is the same as that of the dummy gate electrode 42. In this case, a channel is formed not only below the gate electrode 41 but also below the dummy gate electrode 42. When the channel reaches the end of the isolation region RX (the trench insulating film 21) and comes in contact with crystal defects, a leak current is likely to occur. However, according to the present embodiment, the gate electrode 41 and the dummy gate electrode 42 are separated from each other, and potentials thereof are controlled independently. More specifically, the ground potential GND is applied to the dummy gate electrode 42 in the case of the N-channel transistor, and the power supply potential VDD is applied to the dummy gate electrode 42 in the case of the P-channel transistor. Accordingly, the leak current resulting from the channel formed immediately below the dummy gate electrode 42 is prevented. Moreover, since the gate electrode 41 is separated from the dummy gate electrode 42, increase in capacity is suppressed, which prevents enhancement of the switching time of the transistor.

Moreover, as shown in FIG. 2, the source 61 and the drain 62 are located apart from the isolation region RX (the trench insulating film 21). As shown in FIG. 1, such a structure covers almost whole of the boundary B between the isolation region RX and the active region RY. Therefore, the probability of the diffusion region (61, 62) coming in contact with the crystal defects at the end of the isolation region RX is decreased considerably. As a result, the leak current due to the crystal defects is reduced.

Manufacturing Method:

FIGS. 3A to 3E are cross-sectional views showing processes of manufacturing the semiconductor device 1a according to the first embodiment of the present invention. Each cross-sectional view shows a cross section taken along the line II-II' in FIG. 1.

Figure 3A:
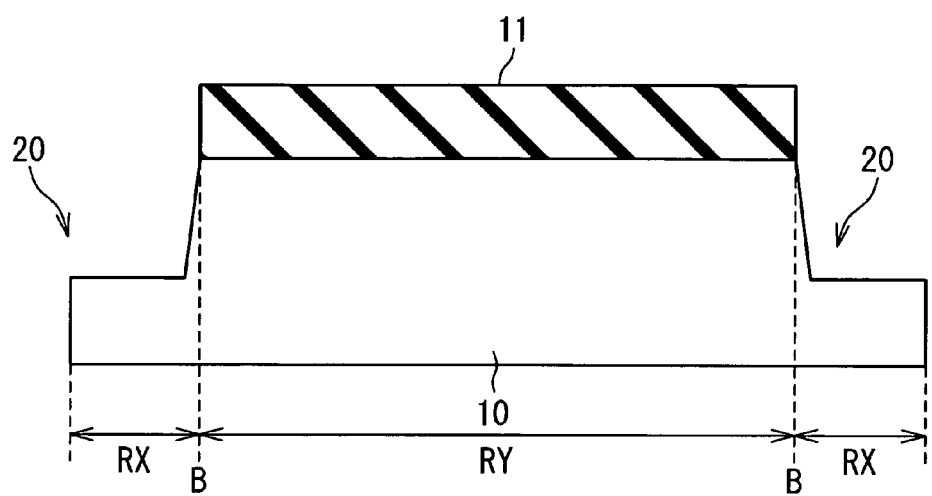
FIG. 3A is a cross-sectional view showing a process of manufacturing the semiconductor device according to the first embodiment of the present invention.

First, as shown in FIG. 3A, a mask 11 made of a silicon nitride film and the like is formed on a substrate 10 at a position corresponding to the active region RY. Subsequently, the substrate 10 is etched by using the mask 11 to form a trench 20. The trench 20 is formed at a position corresponding to the isolation region RX.

Figure 3B:
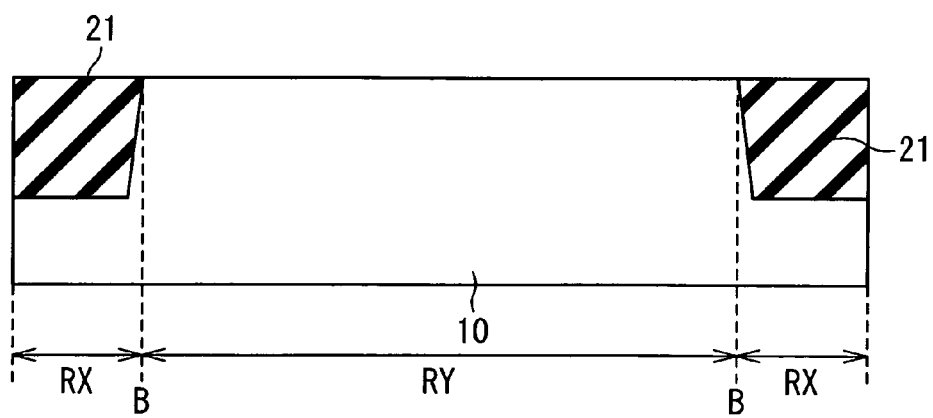
FIG. 3B is a cross-sectional view showing a process of manufacturing the semiconductor device according to the first embodiment of the present invention.

Next, an insulating film is deposited on the entire surface through a CVD method or the like. After that, excess insulating film and the foregoing mask 11 are removed through a CMP (Chemical Mechanical Polishing) process and the like. As a result, an STI structure shown in FIG. 3B is obtained, in which a trench insulating film 21 is embedded within the trench 20. In this manner, the isolation region (device isolation structure) RX surrounding the active region RY is formed in the substrate 10.

Figure 3C:
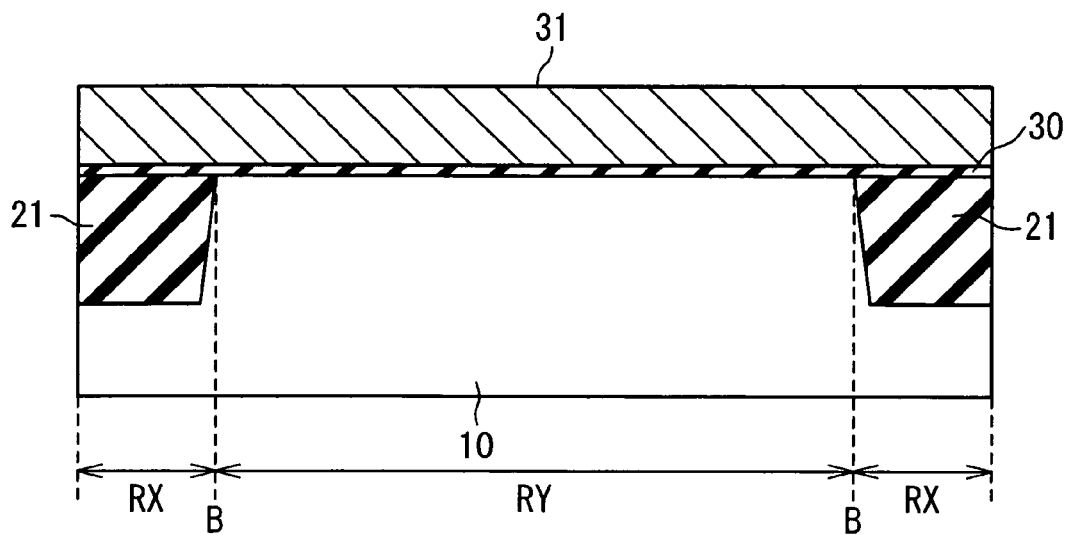
FIG. 3C is a cross-sectional view showing a process of manufacturing the semiconductor device according to the first embodiment of the present invention.

Next, as shown in FIG. 3C, a gate insulating film 30 is formed on the substrate 10, and a gate polysilicon 31 as a material of a gate electrode is deposited on the gate insulating film 30.

Figure 3D:
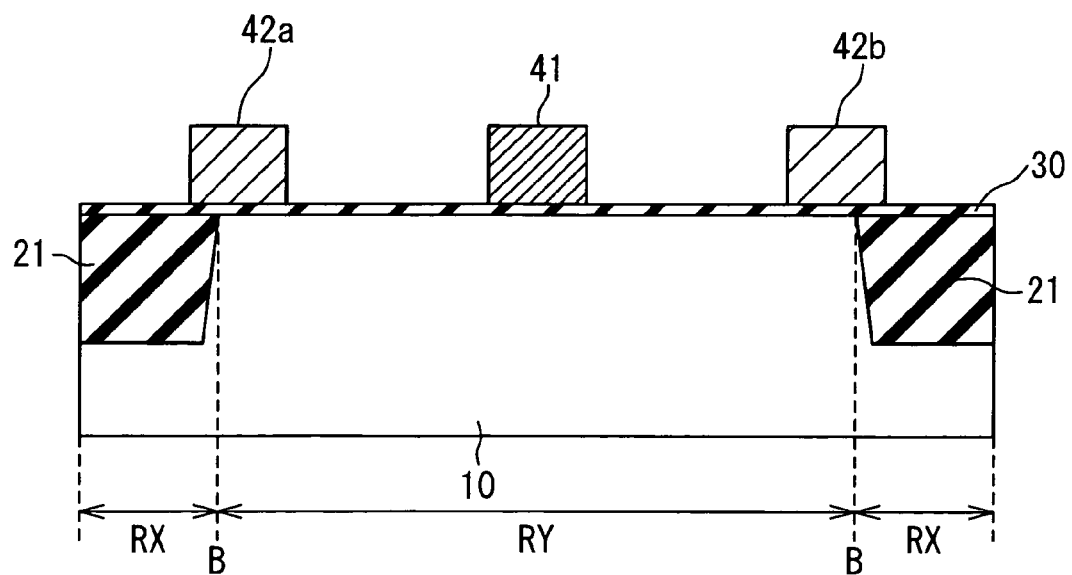
FIG. 3D is a cross-sectional view showing a process of manufacturing the semiconductor device according to the first embodiment of the present invention.

Next, a resist is formed on the gate polysilicon 31. The resist has a pattern of the gate electrode 41 and the dummy gate electrodes 42a and 42b as shown in FIG. 1. Subsequently, the gate polysilicon 31 is etched by using the resist as a mask to form the gate electrode 41 and the dummy gate electrodes 42a and 42b. The gate electrode 41 is formed above the active region RY. The dummy gate electrodes 42a and 42b are formed to overlap at least a part of the boundary B between the isolation region RX and the active region RY. The gate electrode 41 and the dummy gate electrodes 42a and 42b are formed to be separated from each other. After that, the resist is removed, and a structure shown in FIG. 3D is obtained.

Figure 3E:
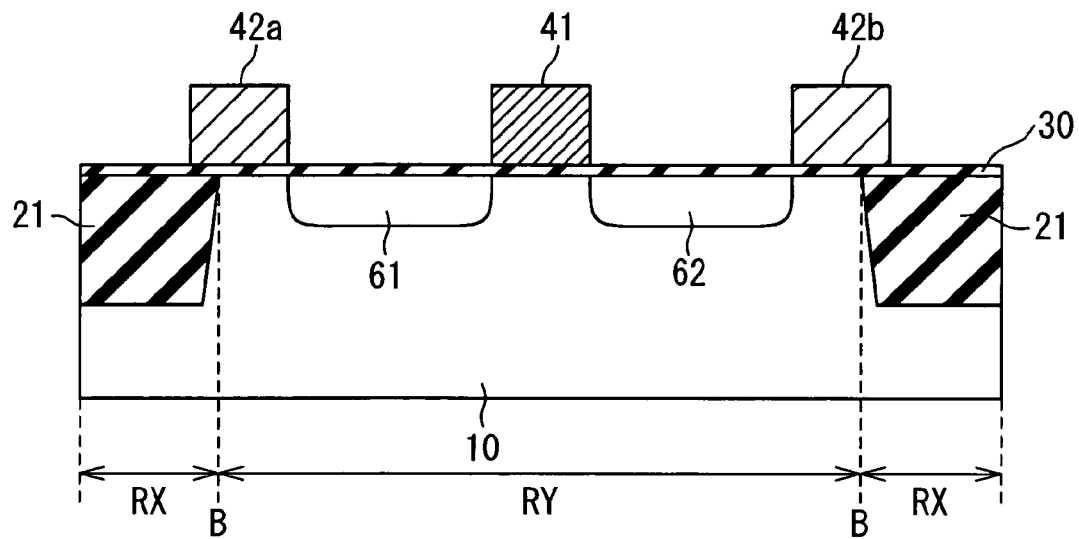
FIG. 3E is a cross-sectional view showing a process of manufacturing the semiconductor device according to the first embodiment of the present invention.

Next, impurity ions are injected into the substrate 10 with using the formed gate electrode 41 and the dummy gate electrodes 42a and 42b as a mask. As a result, as shown in FIG. 3E, diffusion regions (the source 61 and the drain 62) are formed in the active region RY of the substrate 10 in a self-aligned way. That is, the diffusion regions are self-aligned with the gate electrode 41 and the dummy gate electrodes 42a and 42b. The source 61 and the drain 62 are formed on both sides of the gate electrode 41, respectively. Moreover, an edge of the dummy gate electrode 42a is substantially aligned with an edge of the source 61, and an edge of the dummy gate electrode 42b is substantially aligned with an edge of the drain 62. Since the dummy gate electrodes 42a and 42b are formed to cover the boundary B as mentioned above, the source 61 and the drain 62 are formed so as not to contact the trench insulating film 21. As a result, the leak current caused by the crystal defects is reduced.

Figure 3F:
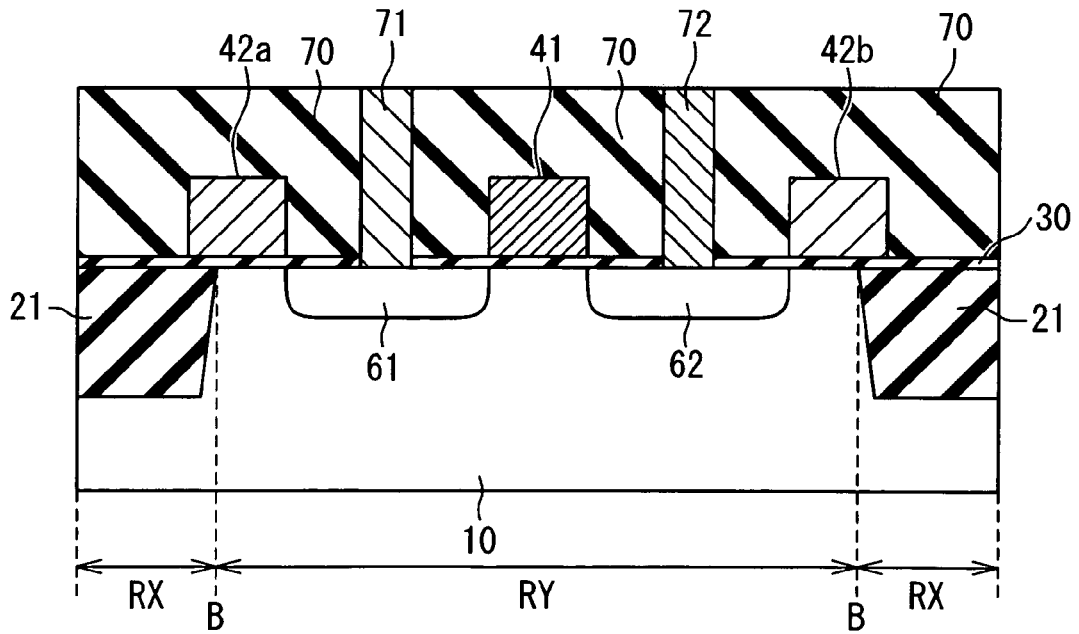
FIG. 3F is a cross-sectional view showing a process of manufacturing the semiconductor device according to the first embodiment of the present invention.

Next, as shown in FIG. 3F, an interlayer insulating film 70 is formed on an entire surface. Subsequently, contacts 71 and 72 are formed to penetrate through the interlayer insulating film 70 and the gate insulating film 30 such that the contacts 71 and 72 are connected to the source 61 and the drain 62, respectively. In this manner, the semiconductor device 1a according to the present embodiment of the present invention is manufactured.

As described above, according to the semiconductor device and the manufacturing method of the first embodiment of the present invention, the leak current is reduced. Thus, reliability of the semiconductor device is improved.

Second Embodiment

Structure:

FIG. 4 is a plan view showing a structure of a semiconductor device 1b according to a second embodiment of the present invention. FIG. 5 is a cross-sectional view taken along a line V-V' in FIG. 4. In FIGS. 4 and 5, the same reference numerals as in the first embodiment are given to similar components to those in the first embodiment, and description thereof is omitted as appropriate.

In the present embodiment, a gate electrode 51 is formed to have an opening 55. The opening 55 is located above the active region RY. For example, as shown in FIG. 4, the gate electrode 51 has a ring portion. The ring portion has a ring shape and is located above the active region RY. In the case of the ring-shaped gate electrode 51 (ring gate), an area in which the gate electrode overlaps an end of the diffusion layer is reduced as compared with the case of the normal gate electrode 41 shown in FIG. 1. The ring-shaped gate electrode 51 is preferable in that deficiency due to the overlapping can be suppressed. Furthermore, in the case of the normal linear-shaped gate electrode 41, a channel width depends on variation in the size of the STI (isolation region RX). However, in the case of the ring-shaped gate electrode 51, the channel width coincides with a ring gate circumference and does not depend on variation in the size of the STI. Since the ON current of the transistor is proportional to the channel width, the ring gate has an advantage in that variation of the ON current is smaller as compared with the case of the linear-shaped gate electrode.

In the case of the gate electrode 51 having the opening 55, a drain 62 is formed in a region of the substrate 10 associated with the opening 55. On the other hand, a source 61 is formed in a region of the substrate 10 associated with the outside of the gate electrode 51. Alternatively, a source 61 may be formed in a region associated with the opening 55, and a drain 62 may be formed in a region associated with the outside of the gate electrode 51. In either case, the gate electrode 51 is formed on a channel region between the source 61 and the drain 62 through the gate insulating film 30.

As shown in FIG. 5, the drain 62 is formed in the active region RY between gate electrodes 51a and 51b. Also, sources 61a and 61b are formed so as not to contact the trench insulating film 21. That is, the sources 61a and 61b are located apart from the isolation region RX. The sources 61a and 61b are connected to contacts 71a and 71b, respectively, which are formed to penetrate through the interlayer insulating film 70 and the gate insulating film 30. The drain 62 is connected to a contact 72 formed to penetrate through the interlayer insulating film 70 and the gate insulating film 30.

In the present embodiment, a dummy gate electrode 52 other than the gate electrode 51 is formed on the gate insulating film 30. As shown in FIGS. 4 and 5, the dummy gate electrode 52 (52a and 52b) is formed to overlap at least a part of the boundary B between the isolation region RX and the active region RY. More specifically, as shown in FIG. 4, the dummy gate electrode 52 is formed along the boundary B to surround the ring-shaped gate electrode 51. As shown in FIG. 5, the dummy gate electrodes 52a and 52b are formed to straddle over the isolation region RX and the active region RY. Here, an edge of the dummy gate electrode 52a is substantially aligned with an edge of the source 61a, and an edge of the dummy gate electrode 52b is substantially aligned with an edge of the source 61b.

As described above, the semiconductor device 1b according to the present embodiment has the gate electrode 51 and the dummy gate electrode 52. As shown in FIG. 4, the gate electrode 51 and the dummy gate electrode 52 are connected to gate contacts 73, respectively. In the present embodiment, the gate electrode 51 and the dummy gate electrode 52 are physically separated from each other, and are electrically disconnected from each other. Thus, a potential applied to the dummy gate electrode 52 is independent from a potential applied to the gate electrode 51. That is to say, the potential applied to the dummy gate electrode 52 through the gate contact 73 can be different from the potential applied to the gate electrode 51 through the gate contact 73.

Operation:

According to the second embodiment of the present invention, the potential of the dummy gate electrode 52 and the potential of the gate electrode 51 are controlled independently. Applied to the dummy gate electrode 52 is a substrate potential which is applied to the substrate 10. For example, when a conductivity type of the source 61 and the drain 62 is N-type, namely, when an N-channel transistor is configured, a positive potential is applied to the gate electrode 51 and a ground potential GND is applied to the dummy gate electrode 52 at the time when the N-channel transistor is turned ON. On the other hand, when the conductivity type of the source 61 and the drain 62 is P-type, namely, a P-channel transistor is configured, a ground potential is applied to the gate electrode 51 and a power supply potential VDD is applied to the dummy gate electrode 52.

Effects of the semiconductor device 1b with the above-mentioned structure and operation are as follows.

If the gate electrode 51 and the dummy gate electrode 52 are electrically connected to each other, the potential of the gate electrode 51 is the same as that of the dummy gate electrode 52. In this case, a channel is formed not only below the gate electrode 51 but also below the dummy gate electrode 52. When the channel reaches the end of the isolation region RX (the trench insulating film 21) and comes in contact with crystal defects, a leak current is likely to occur. However, according to the present embodiment, the gate electrode 51 and the dummy gate electrode 52 are separated from each other, and potentials thereof are controlled independently. More specifically, the ground potential GND is applied to the dummy gate electrode 52 in the case of the N-channel transistor, and the power supply potential VDD is applied to the dummy gate electrode 52 in the case of the P-channel transistor. Accordingly, the leak current resulting from the channel formed immediately below the dummy gate electrode 52 is prevented. Moreover, since the gate electrode 51 is separated from the dummy gate electrode 52, increase in capacity is suppressed, which prevents enhancement of the switching time of the transistor.

Moreover, as shown in FIG. 5, the sources 61a, 61b and the drain 62 are located apart from the isolation region RX (the trench insulating film 21). As shown in FIG. 4, such a structure covers almost whole of the boundary B between the isolation region RX and the active region RY. In particular, the gate electrode 51 according to the present embodiment has the ring shape, which can reduce points at which the gate electrode intersects with the boundary B as compared with the first embodiment. In other words, the length of the boundary B covered by the dummy gate electrode can be longer as compared with the first embodiment. Therefore, the probability of the diffusion region (61, 62) coming in contact with the crystal defects at the end of the isolation region RX is further decreased. As a result, the leak current due to the crystal defects is further reduced.

Figure 6A:
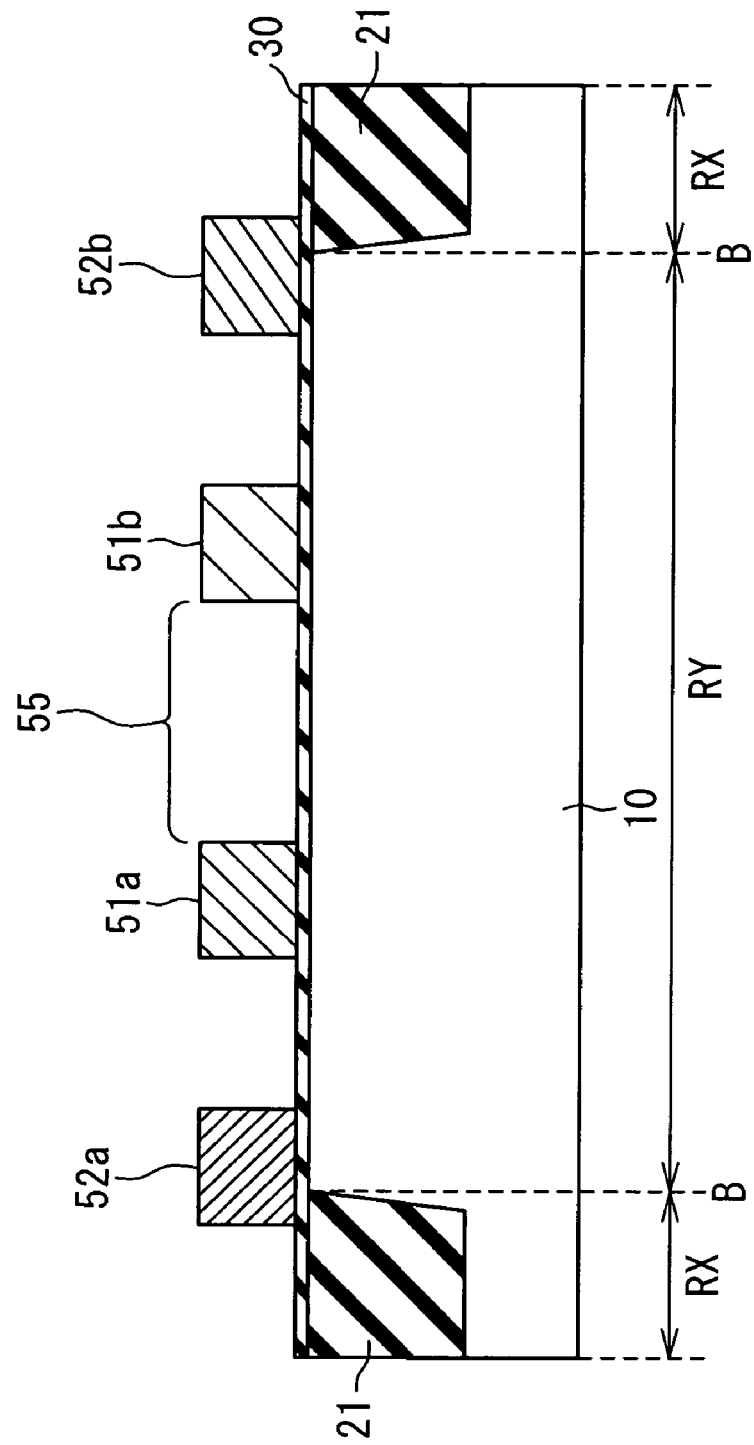
FIG. 6A is a cross-sectional view showing a process of manufacturing the semiconductor device according to the second embodiment of the present invention.
Figure 6B:
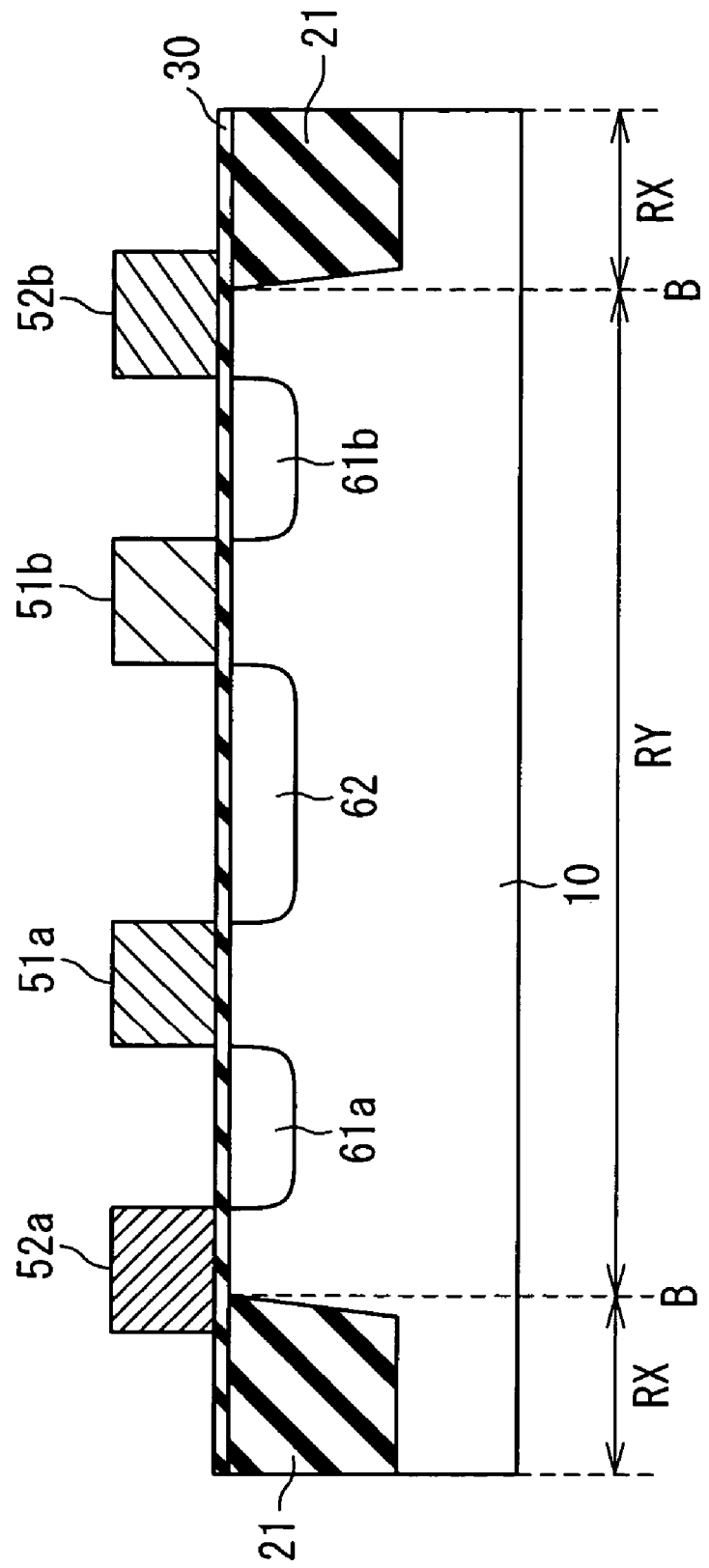
FIG. 6B is a cross-sectional view showing a process of manufacturing the semiconductor device according to the second embodiment of the present invention.
Figure 6C:
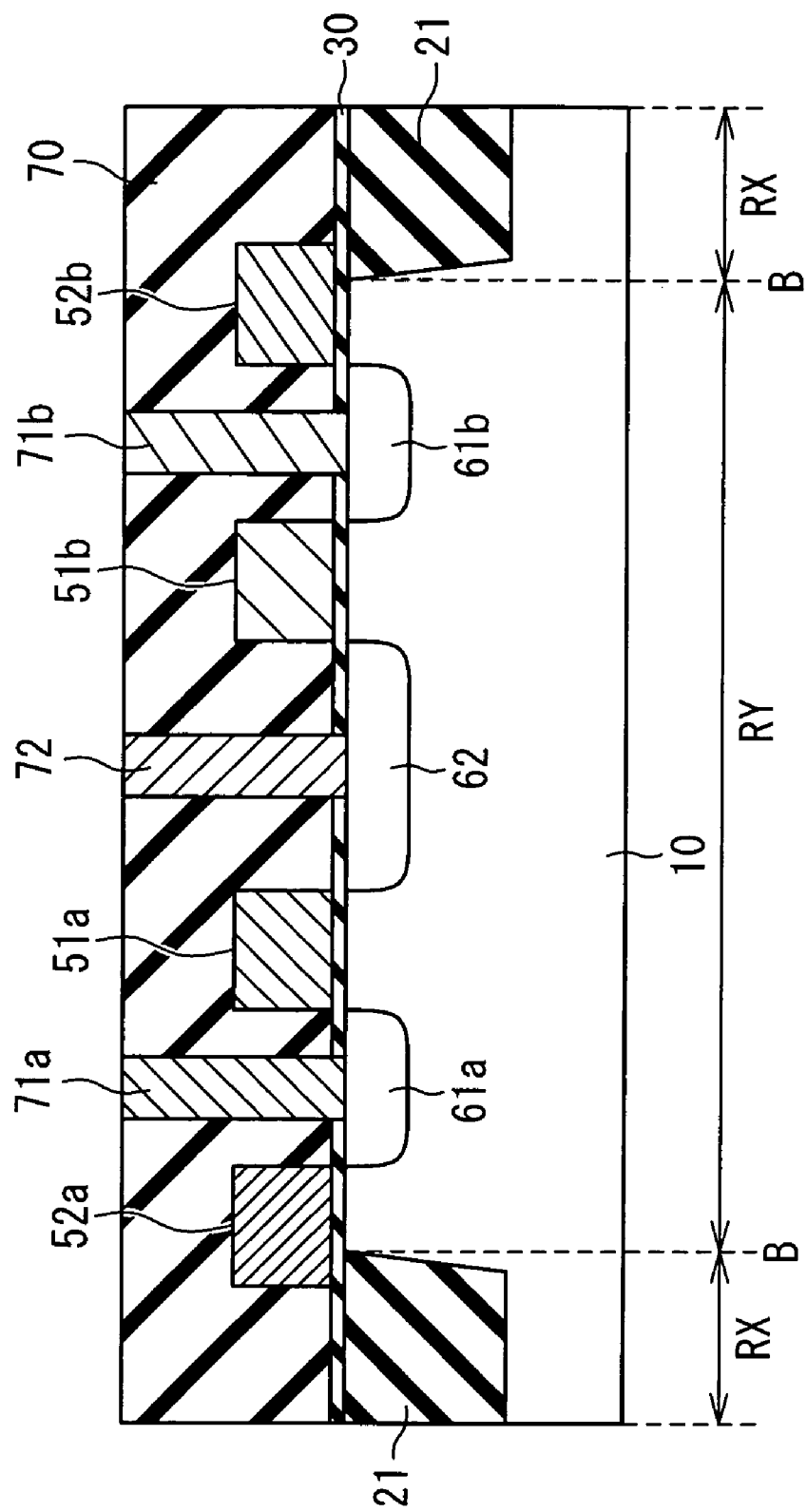
FIG. 6C is a cross-sectional view showing a process of manufacturing the semiconductor device according to the second embodiment of the present invention.

Manufacturing Method:

FIGS. 6A to 6C are cross-sectional views showing processes of manufacturing the semiconductor device 1b according to the second embodiment of the present invention. Each cross-sectional view shows a cross section taken along the line V-V' in FIG. 4.

First, similar processes as in the first embodiment shown in FIGS. 3A to 3C are carried out.

Next, a resist is formed on the gate polysilicon 31. The resist has a pattern of the gate electrode 51 and the dummy gate electrode 52 as shown in FIG. 4. Subsequently, the gate polysilicon 31 is etched by using the resist as a mask to form the gate electrode 51 (51a, 51b) and the dummy gate electrodes 52a, 52b. The gate electrode 51 is formed in the ring shape to have the opening 55 above the active region RY. The dummy gate electrodes 52a and 52b are formed to overlap at least a part of the boundary B between the isolation region RX and the active region RY. The gate electrode 51 and the dummy gate electrode 52 are formed to be separated from each other. After that, the resist is removed, and a structure shown in FIG. 6A is obtained.

Next, impurity ions are injected into the substrate 10 with using the formed gate electrode 51 and the dummy gate electrode 52 as a mask. As a result, as shown in FIG. 6B, diffusion regions (the sources 61a, 61b and the drain 62) are formed in the active region RY of the substrate 10 in a self-aligned way. That is, the diffusion regions are self-aligned with the gate electrode 51 and the dummy gate electrode 52. The drain 62 is formed in the substrate 10 between the gate electrodes 51a and 51b. The source 61a is formed in the substrate 10 between the gate electrode 51a and the dummy gate electrode 52a, and the source 61b is formed in the substrate 10 between the gate electrode 51b and the dummy gate electrode 52b. Since the dummy gate electrodes 52a and 52b are formed to cover the boundary B as mentioned above, the sources 61a and 61B are formed so as not to contact the trench insulating film 21. As a result, the leak current caused by the crystal defects is reduced.

Next, as shown in FIG. 6C, an interlayer insulating film 70 is formed on an entire surface. Subsequently, contacts 71a, 71b and 72 are formed to penetrate through the interlayer insulating film 70 and the gate insulating film 30 such that the contacts 71a, 71b and 72 are connected to the sources 61a, 61b and the drain 62, respectively. In this manner, the semiconductor device 1b according to the present embodiment of the present invention is manufactured.

As described above, according to the semiconductor device and the manufacturing method of the second embodiment of the present invention, the leak current is reduced. Thus, reliability of the semiconductor device is improved.

It should be noted that the present invention can be applied not only to the above-mentioned case where the isolation region RX is formed by the STI method but also to a case where the isolation region RX is formed by the LOCOS method or the like.

It is apparent that the present invention is not limited to the above embodiment, and that may be modified and changed without departing from the scope and spirit of the invention.

What is claimed is:

1. A semiconductor device comprising:
   a substrate having an active region surrounded by an isolation region;
   a first gate electrode formed on said active region through a gate insulating film;
   a second gate electrode formed on said gate insulating film, said second gate electrode being located on both opposite sides of said first gate electrode when viewed in cross section and having a bent shape overlapping a boundary between said active region and said isolation region, said second gate electrode being separated from said first gate electrode; and
   a source and a drain formed in said active region and located apart from said isolation region,
   wherein said second gate electrode includes two C-shaped parts whose apertures face each other, said two C-shaped parts being located on opposite sides of said first gate electrode when viewed in cross section, and
   further comprising a first contact to one of said source and drain inside the aperture of one said C-shaped parts and a second contact to one of said source and drain inside the aperture of the opposite one of said C-shaped parts.

2. The semiconductor device according to claim 1, wherein said first gate electrode has an opening and said opening is located above said active region.

3. The semiconductor device according to claim 1, wherein said first gate electrode has a ring portion and said ring portion is located above said active region.

4. The semiconductor device according to claim 1, wherein a substrate potential applied to said substrate is applied to said second gate electrode.

5. The semiconductor device according to claim 1, wherein a potential applied to said first gate electrode is independent from a potential applied to said second gate electrode.

* * * * *